United States Patent [19]

Wakai

[11] Patent Number: 4,697,267
[45] Date of Patent: Sep. 29, 1987

[54] SCAN CONTROL APPARATUS AND METHOD FOR DATA PROCESSING APPARATUS

[75] Inventor: Katsuro Wakai, Hadano, Japan

[73] Assignee: Hitachi, Ltd., Tokyo, Japan

[21] Appl. No.: 799,973

[22] Filed: Nov. 20, 1985

[30] Foreign Application Priority Data

Nov. 21, 1984 [JP] Japan .................................. 59-244419

[51] Int. Cl.⁴ ............................................ G01R 31/28
[52] U.S. Cl. ...................................... 371/25; 324/73 R
[58] Field of Search ........................ 371/25; 324/73 R

[56] References Cited

U.S. PATENT DOCUMENTS 4,597,042  6/1986  d'Angeac et al. .................... 364/200
4,604,746  8/1986  Blum ..................................... 371/25

Primary Examiner—Charles E. Atkinson
Attorney, Agent, or Firm—Antonelli, Terry & Wands

[57] ABSTRACT

A scan control apparatus performs data scan-in operation to data storage elements each constituting a bit of data unit. Data of the plural data storage elements designated by scan address are read out into a register where the data at the bit position designated by the scan address is replaced by data to be scanned-in. Subsequently, the plurality of the data storage elements are reset simultaneously to thereby set the data in the register to the original data storage elements.

6 Claims, 6 Drawing Figures

SCAN CONTROL APPARATUS AND METHOD FOR DATA PROCESSING APPARATUS

BACKGROUND OF THE INVENTION

The present invention relates to scan control apparatus and method for operation of a data processing apparatus.

Among techniques which have been heretofore adopted widely as an effective maintenance and diagnosis method for a data processing apparatus, there can be mentioned a scan-in/scan-out control system. With the term "scan", it is intended to mean that addresses (referred to as the scan address) are assigned specifically to data storage elements such as registers, flip-flops, memories and the like incorporated in the data processing apparatus, wherein writing of a predetermined value (referred to as a scan-in operation) or reading of a predetermined value (referred to as a scan-out operation) to or from specific or given data storage elements is performed in accordance with a so-called scan logic independent of an ordinary logic operation.

Important applications of the scan-in/scan-out control include a micro-diagnosis in which the diagnosis of logic is performed by writing data which is then read out to be compared with an expected value, and a so-called logout operation in which upon occurrence of failure in a data processing apparatus, the states of the individual data storage element are read out to be stored in an external memory for performing analysis of the failure. In recent years, there has been a growing tendency to provide a great number of logic elements in a single chip in accordance with progress in semiconductor technology. Under the circumstance, difficulty is encountered in observing externally the logical signals with the aid of logic scope. Accordingly, the scan-in/scan-out operation capable of writing and reading data straightforwardly in and from the logic elements assumes great importance.

In the hitherto known scan-in/scan-out control, the allocation of the scan addresses of the individual data storage elements is made such that logically significant individual bits of flip-flops constituting a register of one byte (8 bits) are arrayed in the same scan address or alternatively those words which bear logically important relations are disposed adjacent to one another for convenience to the hardware and/or software which makes use off the scan-in/scan-out operation. However, packaging conditions for realizing logic elements, e.g. the packaging conditions for LSI (large scale integration) chips and package (board incorporating a large number of LSIs) frequently mismatch logical conditions, involving a disadvantage that a great number of logic gates have to be used for preparing the scan address of a logical array or configuration. Besides, in case the burden imposed by the logic arrangement increases excessively, the logically significant (meaningful) array of the scan address has to be abandoned, and the logically significant data must be divided and allocated to a number of scan addresses, which results in an increased burden on the user. Further, alteration of the logic exerts a direct influence on the allocation of the scan addresses, with the result that the frequency of alteration of the allocation of the scan addresses is increased, which in turn means that the required number of man-hours is remarkably increased in handling the hardware and software in which the scan-in/scan-out operation is frequently resorted to.

U.S. patent application Ser. No. 578,793 (filed on Feb. 10, 1984) discloses a scan control apparatus and method for solving the problems mentioned above. According to the teaching disclosed in this U.S. Application, physical scan addresses are allocated to the data storage elements in conformance with the packaging configuration, while logically edited scan addresses are allocated to the data storage elements independent of the physical scan addresses. In the scan operation, the scan address is given by the logical address and translated to the physical scan address in accordance with the logical scan address, wherein the scan-in or scan-out operation is performed on the basis of the physical scan address. Accordingly, the logical scan address can be allocated, for example, on the basis of registers each constituting a logically significant byte without being subjected to constraints imposed by the packaging conditions, while the physical scan address can be allocated in conformance with the packaging conditions independent of the logically significant unit.

According to the exemplary embodiment disclosed in the above U.S. patent application, a translation table is referred to using the logical scan address indicating the scan-in or scan-out operation to derive a plurality of physical scan addresses on a bit basis. More specifically, a logical address indicates a register of one logically significant byte. Accordingly, the logical address is translated into eight physical scan addresses designating eight latches each of one bit. In accordance with the eight physical scan addresses, the scan-in/scan-out operation is sequentially performed bit by bit. The system in which the scan-in operation is performed on the bit basis however suffers another problem that the logical scale of the data processing apparatus as a whole is increased, because two gates are required, respectively, for the set ("1") input and the reset ("0") input to each of the latches each of one bit.

SUMMARY OF THE INVENTION

An object of the present invention is to provide a scan control apparatus in which the number of logic gates required for the scan-in operation can be significantly reduced.

Another object of the present invention is to provide a scan control method for the scan-in operation.

According to an aspect of the invention, the data storage elements are divided or grouped into a data unit (or unit data) including a plurality of bits. The contents of the data storage elements of the data unit including the data storage elements designated by the scan address are first read out. A bit contained in the data as read out and designated by the scan address is replaced by scan-in data. Subsequently, after all the bits of the data storage elements of the data unit as read out have been reset, the data read out and partially modified by the bit replacement are set to the original data storage elements. In this manner, the data to be scanned-in is set to the data storage element of one bit to be scanned-in.

DESCRIPTION OF THE PREFERRED EMBODIMENTS

Figure 1:
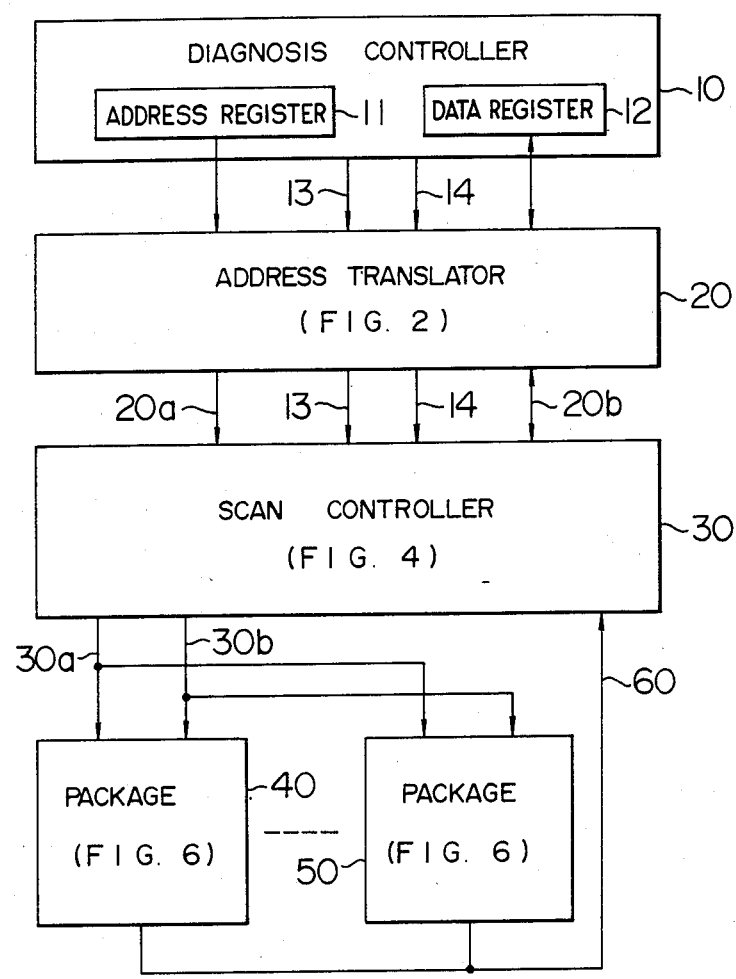
FIG. 1 is a block diagram showing a general arrangement of a scan control apparatus according to an embodiment of the invention.

Now, the invention will be described in detail in conjunction with an exemplary embodiment by referring to the drawings.

FIG. 1 shows schematically a general arrangement of a scan control apparatus. In the figure, logic circuits for performing ordinary logic operations are omitted from the illustration. A data processing unit is constituted by a number of packages, of which only two packages 40 and 50 are typically shown. A diagnosis controller 10 sets a logical scan address in an address register 11 for performing the scan-in/scan-out operation to data storage elements incorporated in the package 40 or 50, the logical scan address then being supplied to an address translator 20. The logical scan address designates eight data storage elements constituting one logically significant byte as a single data unit, by way of example. Upon scan-in (writing) operation, a data register 12 is loaded with one byte data which is to be scanned-in (written-in) to eight data storage elements designated by the aforementioned logical scan address, which data is then supplied to the address translator 20. On the other hand, upon scan-out (reading) operation, one byte data scanned out (read out) from the package 40 or 50 is placed in the data register 12. The diagnosis controller 10 outputs a scan trigger signal on a line 13 and a scan mode signal on a line 14, the latter designating selectively the scan-in or scan-out operation. More specifically, logic "1" signal is outputted on the line 14 for the scan-in (writing) operation, while logic "0" signal is produced for the scan-out (reading) operation.

In response to the reception of the logical scan address supplied from the diagnosis controller 10, the address translator 20 generates eight physical scan addresses which are supplied to a scan controller 30 by way of a line 20a. Additionally, the address translator 20 transfers data to be scanned-in or data scanned out with the scan controller 30 by way of a line 20b, as will be described hereinafter in more detail by referring to FIG. 2.

The scan controller 30 supplies through a line 30a various signals (which will be explained hereinafter) to the package 40 or 50 in accordance with the physical scan addresses generated by the address translator 20 for performing the scan-in/scan-out operation. Scan-in data (i.e. data to be scanned-in or written-in) appears on the line 30b, while the scanned-out data (i.e. data read out) is produced on a line 60. With regards to this operation, description will be made in detail by referring to FIG. 4. Further, the packages 40 and 50 are exemplified in detail in FIG. 6.

Figure 2:
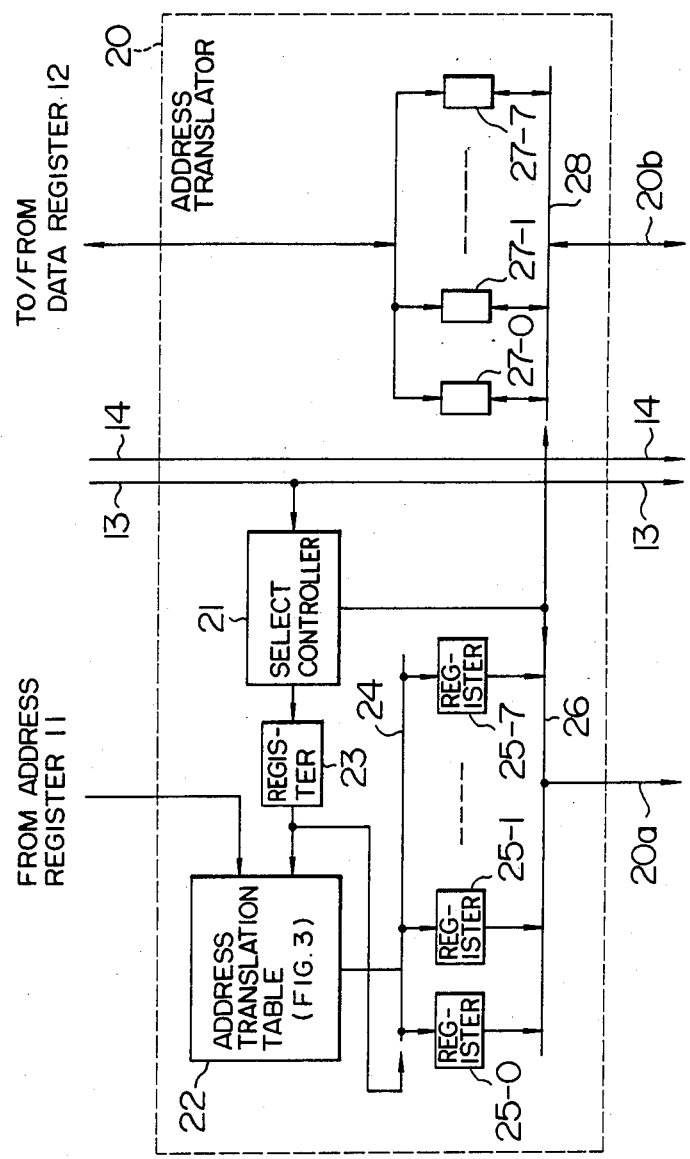
FIG. 2 is a diagram showing a circuit configuration of an address translator employed in the apparatus shown in FIG. 1.

FIG. 2 illustrates in detail a circuit configuration of the address translator 20 shown in FIG. 1. As described above, the address translator 20 receives the logical scan address from the address register 11 incorporated in the diagnosis controller 10. The logical-scan address is first placed in an address translation table 22. A select controller 21 responds to the scan trigger signal supplied thereto through the line 13 from the diagnosis controller 10 to thereby increment sequentially the contents of a three-bit register 23 from "0" to "7" in decimal notation. The address translation table 22 creates eight physical scan addresses each consisting of a more significant address section constituted by the logical scan address supplied from the register 11 and a less significant address section of "0", "2", . . . , or "7" supplied from the address register 23.

Figure 3:
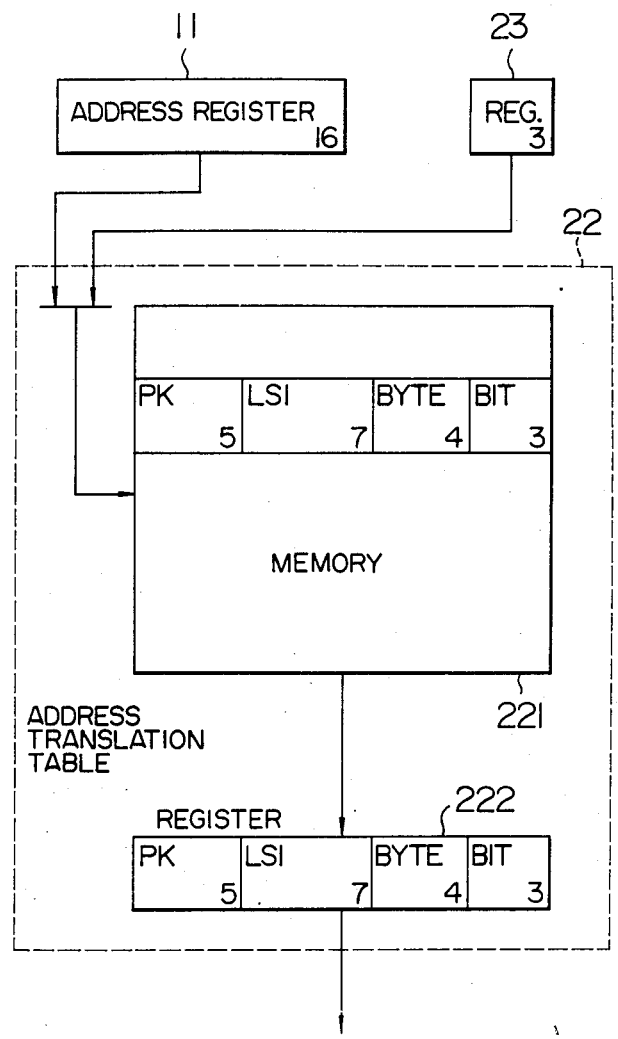
FIG. 3 is a view showing in detail an address translation table employed in the address translator.

FIG. 3 illustrates a scan address translation process together with a format of the address translation table 22.

The address register 11 shown in FIG. 3 is of the same configuration as the address register 11 shown in FIGS. 1 and 2 and contains a logical scan address of 16 bits. Eight bits of each of the logical scan addresses are assigned for constituting one word. In the case of the illustrated embodiment, the scan addresses each of 16 bits and hence 65K words (K = 1,024) of the scan addresses are made available for allocation. Further, there is provided a register 23 containing three bits for indicating the bit position in the scan address. By employing the three bits as the less significant address in combination with the contents of the register 11 as the more significant address, a memory 221 of the translation table 22 can be read out. The output data of the memory 221 is loaded in a register 222 to be subsequently supplied to a group of registers 25-0, 25-1, . . . , 25-7 (FIG. 2). The address translator 20 sequentially increments the contents of the register 23 one by one to read the memory 221 for thereby determining the physical scan addresses each of eight bits which are then stored in the address registers 25-0, 25-1, . . . , 25-7 sequentially through the selector 24 under the command of the register 23 (FIG. 2).

Upon use of this physical scan address for the control purpose, it is divided into 5 bits for a package (PK) field or section, 7 bits for a LSI section, 4 bits for a BYTE section and 3 bits for a BIT section. It should however be noted that such allocation of the numbers of bits is not indispensable for the essence of the present invention but can be correspondingly modified in dependence on practical applications. The PK field or section serves to represent the package identification number. Since the logic arrangement under consideration is assumed to be constituted by at least 32 packages in the case of the illustrated embodiment, the PK field or section requires 5 bits. The LSI field represents the identification numbers of LSIs incorporated in each of the packages PK. With 7 bits of the LSI field, it is possible to identify the LSIs in a number up to 125 at maximum. The BYTE field and the BIT field designate the bit numbers of the individual flip-flops incorporated in each of the LSIs in byte and bit, respectively, wherein the flip-flops up to 128 bits can be identified in each of LSIs.

The logical scan address and the physical scan address for the data storage element typified by the flip-flop can be allocated in a manner mentioned below.

Figure 6:
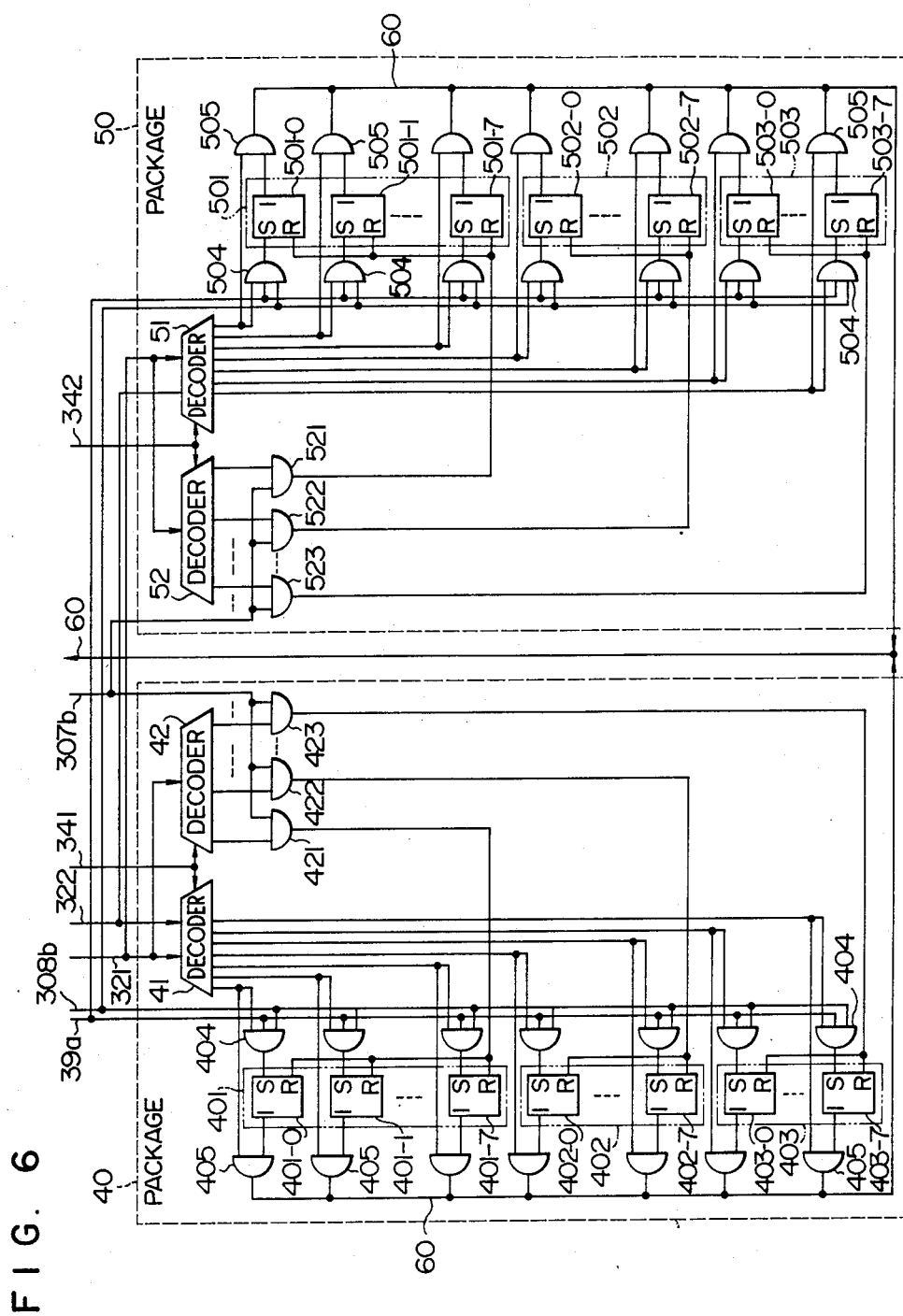
FIG. 6 is a view illustrating in detail configurations of packages shown in FIG. 1.

By way of example, a single register which constitutes one logically significant byte will be considered. It is assumed that one register is constituted by eight flip-flops including four flip-flops 401-0, 401-1, 401-2 and 401-3 on the package 40 and four flip-flops 501-0, 501-1, 501-2 and 501-3 on the package 50, as is illustrated in FIG. 6, and that the flip-flops 401-0 to 401-3 are incorporated in one LSI while the flip-flops 501-0 to 501-3 are incorporated in another LSI.

Concerning the logical scan address, a single common word (e.g. "00000000000000001" in binary notation) is allocated to these eight flip-flops. On the other hand, the physical scan address for each of the flip-flops is constituted by the PK section or field, LSI field and the BYTE field to which the flip-flop under consideration belongs, while the BIT fields are assigned with bit addresses each of three bits in a sequential manner. By way of example, assuming that the logical scan addresses of the flip-flops 401-0 to 401-3 and 501-0 to 501-3 are same so far as the PK, LSI and BYTE fields are concerned, the relationships between the logical scan addresses and the physical scan addresses of these flip-flops are such as listed in the following table.

| FLIP-FLOP | LOGICAL SCAN ADDRESS (18-3) | PHYSICAL SCAN ADDRESS | | | |
|---|---|---|---|---|---|
| | | PK (18-14) | LSI (13-7) | BYTE (6-3) | BIT (2-0) |
| 401-0 | 00000000000000001 | 00001 | 0000001 | 0001 | 000 |
| 401-1 | 00000000000000001 | 00001 | 0000001 | 0001 | 001 |
| 401-2 | 00000000000000001 | 00001 | 0000001 | 0001 | 010 |
| 401-3 | 00000000000000001 | 00001 | 0000001 | 0001 | 011 |
| 501-0 | 00000000000000001 | 00010 | 0010110 | 0110 | 000 |
| 501-1 | 00000000000000001 | 00010 | 0010110 | 0110 | 001 |
| 501-2 | 00000000000000001 | 00010 | 0010110 | 0110 | 010 |
| 501-3 | 00000000000000001 | 00010 | 0010110 | 0110 | 011 |

It goes without saying that when the flip-flops belong to different packages and/or different LSI, they are assigned with correspondingly different addresses.

Turning back to FIG. 2, the address register group 25 includes eight registers 25-0, 25-1, 25-2, . . . , and 25-7 for storing therein eight physical scan addresses, respectively, which are prepared by the address translation table 22. A latch group 27 includes eight latches 27-0, 27-1, . . . , and 27-7 each of one bit. The latches are provided in one-to-one correspondence with the individual address registers 25-0, 25-1, . . . , and 25-7, respectively. These latches 27-0, . . . , 27-7 serve to store one byte of data supplied from the data register 12 and divided on a bit basis. The select controller 21 controls selectors 26 and 28 for sequentially select one set of address and data from the address register group 25 and the latch group 27 to be supplied to the scan controller 30.

Figure 4:
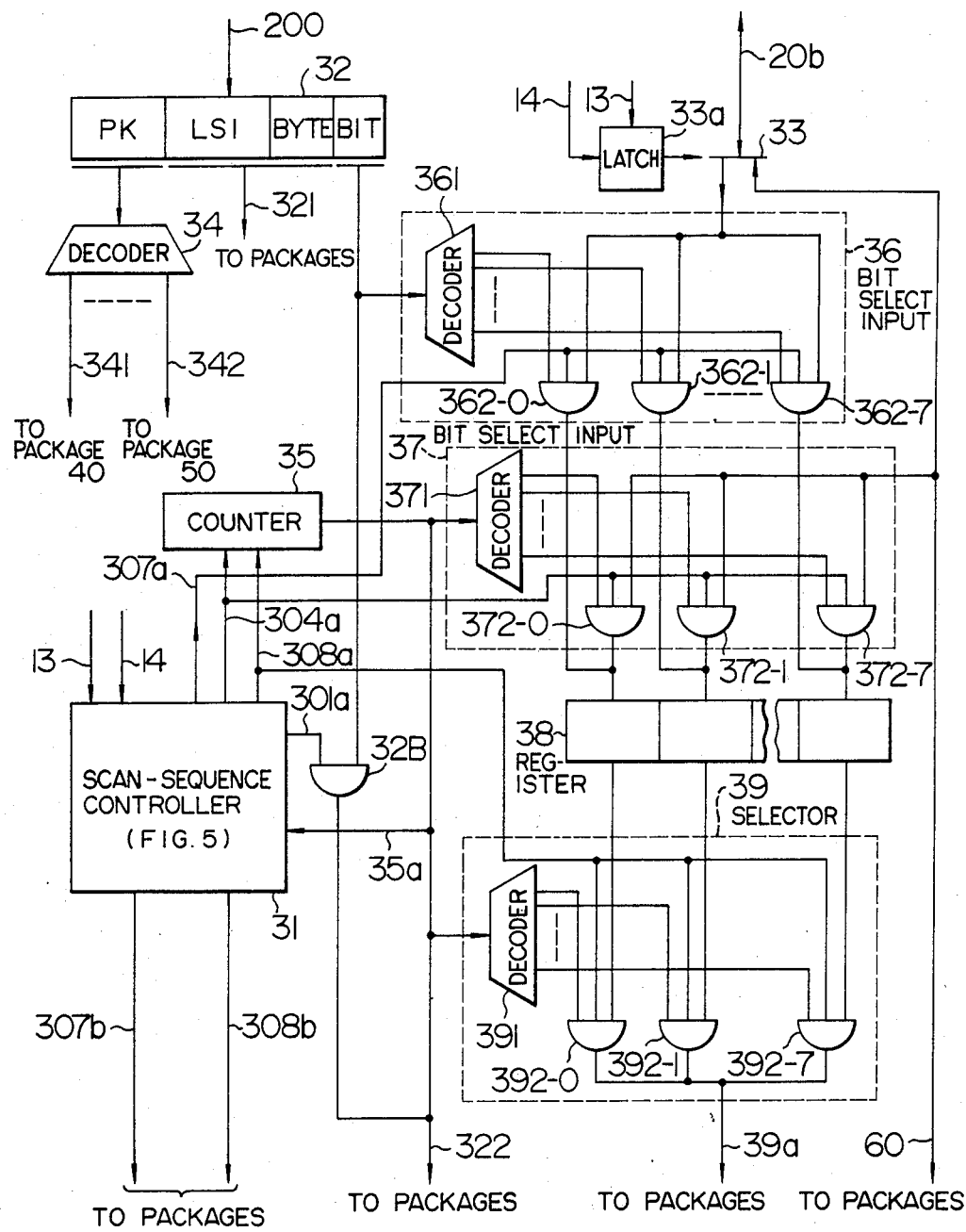
FIG. 4 is a diagram showing a circuit configuration of a scan controller employed in the apparatus shown in FIG. 1.

FIG. 4 shows in detail a circuit configuration of the scan controller 30. The physical scan address supplied from the address translator 20 is placed in a register 32, while the scan-in data of one bit is supplied to a selector 33. A scan sequence controller 31 responds to the scan trigger signal (13) and the scan mode signal (14) produced by the diagnosis controller 10. The scan controller 30 controls the scan-in/scan-out operation performed on the data storage elements incorporated in the package under the control of the scan sequence controller 31. The five bits contained in the PK section of the physical scan address placed in the register 32 are decoded by a decoder 34 having a number of outputs each assigned to one package and supplies an enable signal to the package designated by the address bits contained in the PK field or section. For example, it is illustrated that an output line 341 of the decoder 34 feeds the enable signal to the package 40, while an output line 342 feeds the enable signal to the package 50. The address data exclusive of the PK address data is supplied in common to every package. The selector or gate 33 is controlled by a latch 33a which latches the scan mode signal 14 at the time when the scan trigger signal 13 makes its appearance. Upon scan-in (writing) operation, the scan mode signal 14 is set to logic "1", whereby the scan-in data (i.e. data to be written) is gated to an input circuit 36. In the scan-out (reading) operation, the scan mode signal is set to logic "0", with the result that the data on the scan-out line 60 is gated onto the line 20b.

Before entering into the details of the scan controller, description will be made of the circuit configuration of the packages 40 and 50 illustrated in FIG. 6. Referring to the figure, packages 40 and the 50 may be considered to be of a substantially identical configuration so far as the scan operation is concerned.

The package 40 includes a number of flip-flops serving as the data storage elements implemented in the form of LSI. Three flip-flop groups 401, 402 and 403 are typically illustrated, wherein each group includes eight flip-flops. By way of example, the group 401 includes eight flip-flops 401-0, . . . , 401-7. Although these flip-flops may bear no logically significant relation to one another, they are allocated with one and the same byte address constituting a part of the physical scan address in view of the physical arrangement of these flip-flops. In FIG. 6, it will be understood that the inputs and the outputs of the flip-flops are shown only for the scan-in/scan-out operations and the wirings for effectuating ordinary logic operations are omitted from illustration. The scan-in operation is carried out through AND gates 404 in response to the scan-in signal of logic "1". An AND gate to input the scan-in data of logic "0" is required to be provided on the reset side of each flip-flop. However, this resetting AND gate can be spared by adopting a common reset operation according to the teachings of the invention, as will be elucidated hereinafter. The scan-out operation is effected through AND gates 405. It will be noted that the outputs of all the flip-flops are connected to a common scan-out line 60 so as to be transferred to the scan controller 30. The package 40 includes a pair of decoders 41 and 42 both of which are adapted to be activated through an enable signal line 341 leading to the decoder 34 of the scan controller 30. The decoder 41 has one input (321) for the data of LSI section or field and the BYTE field of the physical scan address and the other input (322) for the BIT field leading to the counter 35 (FIG. 4). On the other hand, the decoder 42 has one input (321) for the address data of the LSI and BYTE of the physical scan address. The decoder 41 is activated by the enable signal applied over the line 341 and applies to the AND gates 404 and 405 a select signal resulted from the decoding operation. The input AND gate 404 responds to the scan-in pulse (on a line 308b) and the scan-in data (on a line 39a) applied simultaneously with the select signal mentioned above to thereby set the associated flip-flop. On the other hand, the output AND gate 405 gates the data of the associated flip-flop to the output in response to the select signal applied from the decoder 41. The latter serves for decoding data of the LSI and BYTE fields of the physical scan address and supplying the select signal to one of the AND gate 421 to 423 provided in association with the flip-flop groups 401 to 403, respectively, for allowing a common reset signal on a line 307b to be applied to one of the flip-flop groups 401 to 403.

The package 50 is basically of a same configuration as that of the package 40. The parts of the package 50 corresponding or equivalent to those of the package 40 are denoted by like reference numerals plus 100. The decoders 51 and 52 serves for the same functions as the decoders 41 and 42. Accordingly, further description of the package 50 will be unnecessary.

Referring again to FIG. 4, the scan controller 30 includes a register 38 of one byte (i.e. 8 bits) having the inputs connected to bit select input circuits 36 and 37 and the outputs connected to a selector 39. The bit select input circuit 37 includes a decoder 371 and eight AND gates 372-0, 372-1, ..., and 372-7 corresponding to individual bits, respectively. The AND gate corresponding to the bit position indicated by the counter 35 is enabled under the control of the scan sequence controller 31, whereby the data read out on the line 60 from the package 40 or 50 is loaded in the register 38. Similarly, the bit select input circuit 36 includes a decoder 361 and eight AND gates 362-0, 361-1, ..., and 362-7 corresponding, respectively, to eight bits constituting one byte. The AND gate corresponding to the bit position designated by the BIT of the physical scan address placed in the register 32 is enabled under the control of the scan sequence controller 31, whereby the scan-in data of one bit supplied from the address translator 20 is loaded in the register 38. The selector 39 includes a decoder 391 and eight AND gates 392-0 to 392-7 corresponding, respectively, to the individual bits constituting one byte. The AND gate corresponding to the bit position indicated by the counter 35 is enabled under the control of the scan sequence controller 31, whereby the data placed in the register 38 can be transferred to the package 40 or 50 as the data to be written over the line 39a.

Figure 5:
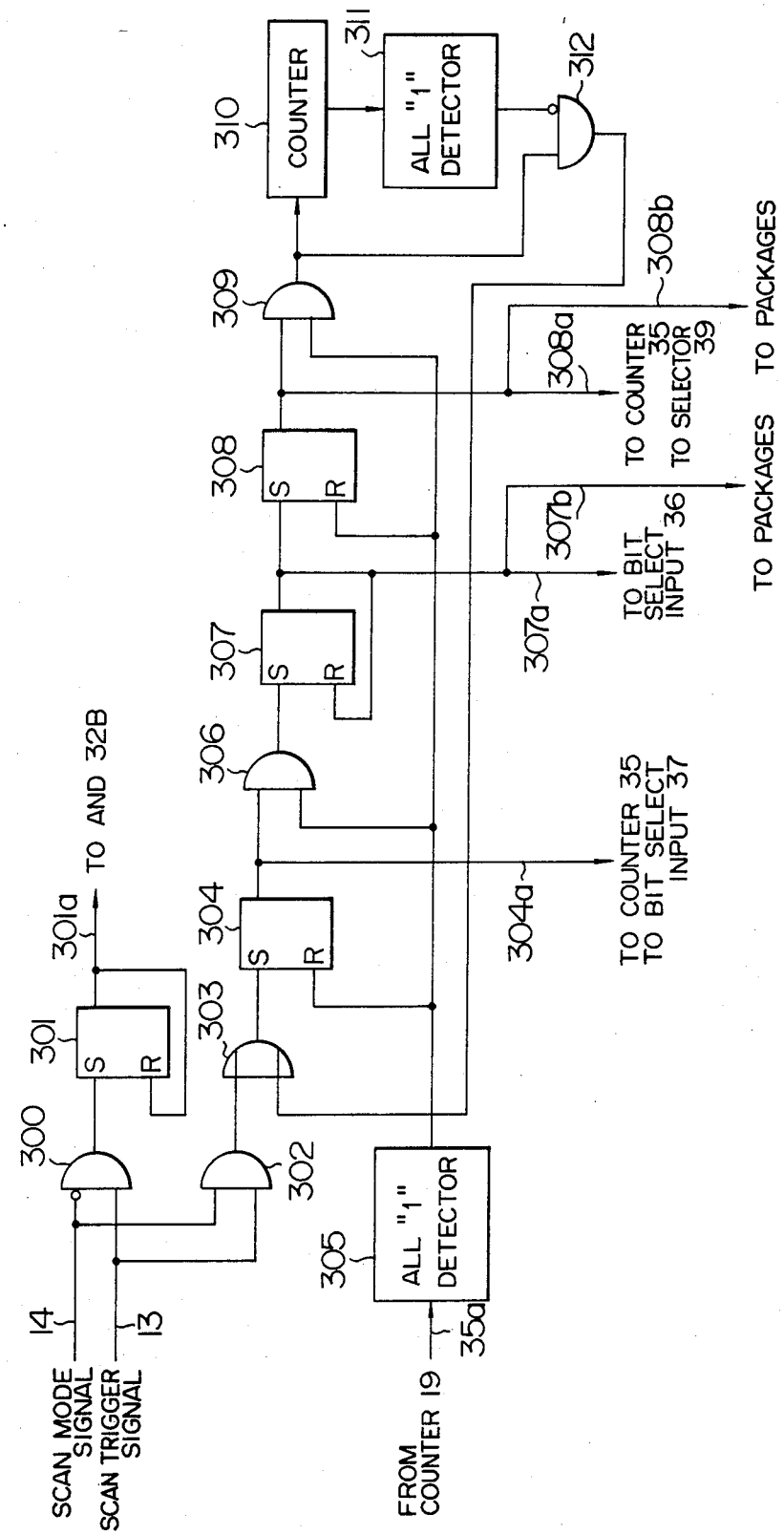
FIG. 5 is a diagram showing in detail a circuit configuration of a scan sequence controller shown in FIG. 4.

FIG. 5 shows in detail a circuit configuration of the scan sequence controller 31. The scan trigger signal line 13 and the scan mode signal line 14 are connected to the inputs of AND gates 300 and 302. In the scan-out operation, the scan mode signal on the line 14 is logic "0", with the result that an AND gate 300 is enabled to thereby set a flip-flop 301. The set output line 301a of the flip-flop 301 is connected to the AND gate 32B (FIG. 4). As a consequence, the BIT data of the physical scan address placed in the register 32 is supplied to the package 40 or 50 through the line 322. Thus, all the bits of the physical scan address have been supplied to the package 40 or 50. In the package 40 or 50 designated by the PK data of the physical scan address, data of one bit read out (scanned out) from the data storage element (flip-flop) designated by the data LSI, BYTE and BIT of the physical scan address is supplied to the latch (FIG. 2) by way of the line 60, the gate 33 and the line 20b. This operation is sequentially performed for all eight bits, whereby the data of one byte indicated by the logical scan address is read out (or scanned out).

In the scan-in (write) mode, the scan mode signal on the line 14 is logic "1". Consequently, the AND gate 302 is enabled to set the flip-flop 304 through an OR gate 303. The set signal on the output line 304a of the flip-flop 304 is inputted to the counter 35 and the AND gates 372-0, 372-1, ..., and 372-7 of the bit select input circuit 37 (FIG. 4). The counter 35 is of three-bit capacity and responds to the signal on the line 304a to count up from "000" ("0" in decimal notation) to "111" ("7" in decimal notation). The output of the counter 35 is sent to the package instead of the BIT data and at the same time to the decoder 371 of the bit select input circuit 37. In response to the count-up of the BIT field indicated by the counter 35, the data unit of one byte designated by the PK, LSI and BYTE data placed in the register 32 is once read out (scanned out). By way of example, it is assumed that the scan-in operation is to be performed to the flip-flop 401-0 of the flip-flop group 401 belonging to the package 40 shown in FIG. 6 under designation by the data of the PK, LSI, BYTE and BIT fields stored in the register 32. Since the data of the BIT field can be replaced by the count output of the counter 35, the contents or states of the eight flip-flops 401-0, ..., 401-7 belonging to the flip-flop group 401 are sequentially scanned out from the output of the decoder 41 as the one byte of data. The data scanned out is placed in the register 38 because the AND gates 372-0, 372-1, ..., 372-7 of the bit select input circuit 37 shown in FIG. 4 are enabled by the output of the decoder 371 in dependence on the count value indicated by the counter 35. In this manner, the contents or states of the eight flip-flops constituting one byte of data inclusive of the one flip-flop indicated by the physical scan address placed in the register 32 are read out. The output of the counter 35 is connected to one input of an all "1" detecting circuit 305 (FIG. 5) of the scan sequence controller 31 by way of a line 35a. When the counter 35 counts up to "111", the all "1" detecting circuit 305 produces the output signal to reset the flip-flop 304, to thereby stop the up-counting operation of the counter 35. Simultaneously, the AND gate 304 is enabled to set the flip-flop 307.

The flip-flop 307 has a set output line 307a connected to the inputs of AND gates 362-0, 362-1, ..., 362-7 of the bit select input circuit 36 (FIG. 4). The latter includes a decoder 361 in which the data of the BIT field of the register 32 is placed. The AND gate corresponding to the bit position indicated by the data BIT contained in the register 32 is enabled. In the case of the example mentioned above, since data of the BIT field is "000", the AND gate 362-0 is enabled, with the result that the scan data of one bit supplied from the address translator 20 is placed in the register 38 at the zero-th bit position. As a consequence, one bit (designated by the register 32) of the one byte of data previously read out from the flip-flop group 401 is replaced by the scan-in data.

The set output (line 307b) of the flip-flop 307 is also fed to each package. In the case of the package 40, this set output of the flip-flop 307 is supplied to the corresponding AND gates 421, 422 and 423, one of which is selected by the decoder 42 adapted to decode the LSI data and the BYTE data. In the case of the aforementioned example, the AND gate 421 associated with the flip-flop group 401 is selected. Accordingly, the output of the AND gate 421 is applied in common to the reset inputs of the eight flip-flops 401-0, 402-2, ..., 401-7 belonging to the flip-flop group 401. As a consequence, all of the flip-flops of this group which contain the unit data of one byte are all reset simultaneously.

Turning back to FIG. 5, the flip-flop 308 is set in succession to the set/reset operations of the flip-flop 307. The set output of flip-flop 308 appearing on the line 308a is supplied to the counter 35 and the AND gates 392-0, 392-1, ..., 392-7 of the selector 39 (FIG. 4). The counter 35 responds to the signal on the line 308a to count up sequentially from "000" to "111". Since the output of the counter 35 is supplied to the decoder 391 of the selector 39, the AND gates 392-1, 392-2, ..., 392-7 are sequentially enabled as the counter 35 counts up, with the result that the zeroth to the seventh bits of the register 38 are sequentially outputted onto the line 39a to be supplied to the package. Simultaneously, the scan-in pulse is produced on the output line 308b of the flip-flop 308. The line 308b is connected to the AND gates 404 inserted on the input side of all the flip-flops of all the packages, allowing the scan-in operation. In dependence on the PK, LSI and the BYTE data fields of the physical scan address contained in the register 32 and the BIT field counted up from "000" to "111" in the counter 35, the decoder 41 writes the data of one byte appearing sequentially or serially on the line 39a in the flip-flops 401-0, 401-1, . . . , 401-7 belonging to the flip-flop group 401. As a consequence, the scan-in data is set at the flip-flop 401-0 designated by the register 32. The seven flip-flops 401-1, 401-2, . . . , 401-7 are restored to the respective original data states. Since all the flip-flops belonging to the group 401 have been previously reset, it is sufficient to enable only the AND gate 404 for the flip-flop to be set to "1". When all "1" detecting circuit 305 detects that the counter 35 has attained the state "111", the AND gate 309 is enabled, whereby the 3-bit counter 310 is incremented by one (in this case, the counter 310 is reset to the state "000"), while the flip-flop 308 is simultaneously reset. The all "1" detecting circuit 311 is connected to the counter 310. Unless the counter 310 is in the state of all "1" (i.e. "7" in decimal notation), the circuit 311 enables the AND gate 312 to thereby set again the flip-flop 304. Thus, the sequence mentioned above is repeated with the bit being changed. At this time, the next physical scan address is placed in the register 32 from the address translator 20, while the scan-in data of one bit is supplied.

When the sequence described above has been repeated eight times, the content of the counter 310 becomes "111". Accordingly, the AND gate 312 is no longer enabled. In this state, the scan-in operation to the flip-flops corresponding to one byte designated by the logical scan address has been accomplished by developing the eight physical scan addresses.

As will be appreciated from the foregoing description, for effecting the scan-in (writing) operation, the unit data of one byte including those flip-flops which are to undergo the scan-in operation and which are designated by the physical scan address are first scanned out (read out) and merged with the scan-in data of one bit. After the flip-flops corresponding to the unit data have been simultaneously reset at one time, data corresponding to the unit data is scanned-in or written (with the result that only one bit is changed). Thus, the scan-in operation can be realized by using two gates (AND gates 404 and 405) for each of the flip-flops. Although the scan controller 30 is more or less complicated, it is possible to spare a great number of logic gates which amounts to several tens of thousands in the data processing apparatus as a whole. Thus, the number of logic gates for scanning the data storage elements in concern can be remarkably reduced according to the invention.

I claim:

1. A scan-in control apparatus for scanning-in data to data storage elements constituting, respectively, bits of a data unit including a plurality of bits, comprising:
   generating means for outputting a trigger signal for initiating the scan-in operation and generating a scan address and scan-in data, said scan address being composed of a first address section indicating the data unit to be scanned-in and a second address section designating a bit in said data unit;
   scan control means connected to said generating means for responding to said trigger signal to thereby output a control signal for controlling the scan-in sequence;
   register means for holding data;
   scan-in means connected to said scan control means for responding to said control signal to thereby connect selectively a plurality of the data storage elements constituting the data unit designated by said first address section of said scan address to said register means for effecting the scan-out of data to said register means from said plurality of the data storage elements and the scan-in of data to said plurality of the data storage elements from said register means;
   reset means connected to said scan control means for responding to said control signal to reset the plurality of data storage elements for the data unit designated by said first address section of said scan address; and
   set means connected to said scan control means for responding to said control signal to set said scan-in data at the bit position of said register means designated by said scan address.

2. A scan-in control apparatus according to claim 1, wherein each of said data storage element has a set input terminal and a reset input terminal as the input terminals, the reset input terminals of the plurality of the data storage elements belonging to a same data unit being connected in common to said reset means.

3. A scan-in control apparatus according to claim 2, wherein said generating means includes:
   first means for outputting the trigger signal for initiating the scan-in operation and generating a logical scan address for designating a logical data unit which is to undergo said scan-in operation and the scan-in data including a plurality of bits to be scanned-in to said logical data units; and
   second means connected to said first means for responding to said trigger signal to thereby translate said logical scan address into a plurality of physical scan addresses each comprising said first address section and said second address section;
   said scan means, said reset means and said set means responding to each of said physical scan addresses.

4. A scan-in control apparatus according to claim 3, wherein said scan control means includes counter means for counting a number equal to the number of bits constituting the single data unit every time when said physical scan address is supplied,
   said scan control means controlling said counter means for controlling the sequence of the scan-in operation to the plurality of information units indicated by the first address sections of said plurality of physical scan addresses;
   said scan means responding to the values indicated by each of said first address sections and said counter means;
   said reset means responding to each of said first address sections; and
   said set means responding to each of second address sections.

5. A scan-in control method for scanning-in data to data storage elements each constituting bits of data unit including a plurality of bits, comprising:
   a first step for generating a scan address composed of a first address section designating the data unit to be scanned-in and a second address section designating a bit in said data unit, and scan-in data;

a second step for reading out data from a plurality of data storage elements included in the data unit designated by said first address section;

a third step for replacing data of a bit of the data read out at said second step by said scan-in data, said bit being designated by said second address section;

a fourth step for resetting simultaneously the contents of the plurality of data storage elements included in the data unit designated by said first address section; and a fifth step for setting data of one data unit including said replaced data at the plurality of original data storage elements designated by said first address section in succession to said fourth step.

6. A scan-in control method according to claim 1, wherein said first step includes:

a sixth step for generating a logical scan address designating a logical data unit which is to undergo the scan-in operation and scan-in data including a plurality of bits to be scanned-in to said logical data unit; and a seventh step for translating said logical scan address to a plurality of physical scan addresses each including said first address section and said second address section;

wherein said second to fifth steps are repeated a number of times equal to the number of said physical scan addresses.

* * * * *